United States Patent
Holtz

[11] Patent Number: 5,576,985
[45] Date of Patent: Nov. 19, 1996

[54] INTEGRATED CONTENT ADDRESSABLE READ ONLY MEMORY

[76] Inventor: Klaus Holtz, 631 O'Farrell #710, San Francisco, Calif. 94109

[21] Appl. No.: 620,908

[22] Filed: Mar. 25, 1996

[51] Int. Cl.$^6$ .................................................. G11C 15/00
[52] U.S. Cl. ............................. 365/49; 365/94; 365/96; 365/105
[58] Field of Search ...................... 365/49, 190, 189.01, 365/185.01, 94, 96, 105, 255.7

[56] References Cited

U.S. PATENT DOCUMENTS

| | | | |
|---|---|---|---|
| 4,845,668 | 7/1989 | Sano et al. | 365/49 |
| 5,301,143 | 4/1994 | Ohri | 365/96 |
| 5,329,488 | 7/1994 | Hashimoto | 365/200 |
| 5,388,065 | 2/1995 | Yoneda | 365/49 |
| 5,396,448 | 3/1995 | Takanayagi et al. | 365/49 |
| 5,483,480 | 1/1996 | Yoneda | 365/49 |

OTHER PUBLICATIONS

Prior Patent Application Holtz Mar. 17, 1993 Serial No. 08/032,143, Elmore Art unit 2319 An Integrated Content Addressable Read Only Memory Device.

Klaus Holtz SuperCon 95, Slide # 33 Fast Data Compression Speeds Data Communications.

Primary Examiner—David C. Nelms
Assistant Examiner—Vu A. Le

[57] ABSTRACT

An integrated memory device can be used as a Content Addressable Memory (CAM) or as a Random Addressable Memory (RAM) for applications in data compression, video compression or Autosophy robots. Memory addressing employs long chains of Field Effect Transistors, forming a logical AND function, and programmable non volatile connection cells which can be implemented either as programmable fuses or memory transistors including PROM, EPROM, EEPROM or FLUSH technologies. Each connection cell is programmable for either connection or non connection. Each chain of Field Effect Transistors may generate any arbitrary output address code which is programmed via diodes and the same non volatile connection cells used to decode the input data words. The device combines extreme low power consumption with very fast search access speed. Devices implemented as flexible thin foils can be folded into very large, compact and robust memory arrays.

9 Claims, 1 Drawing Sheet

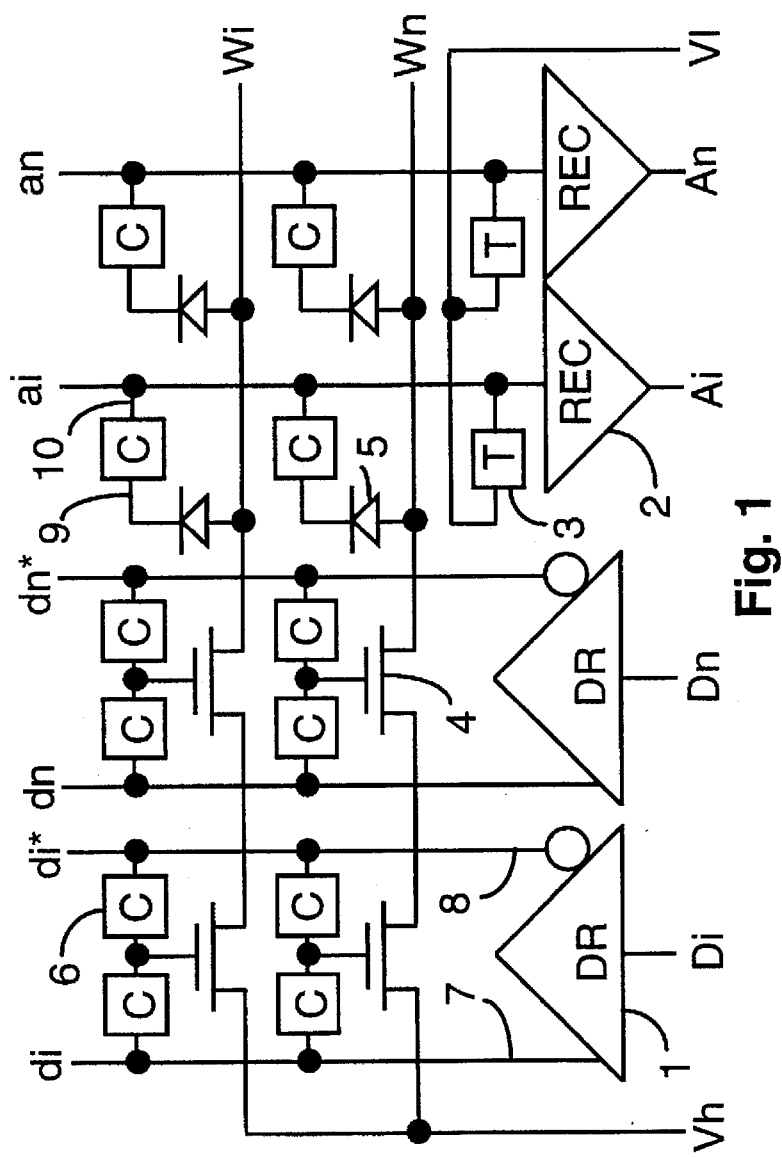
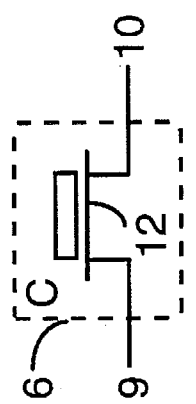
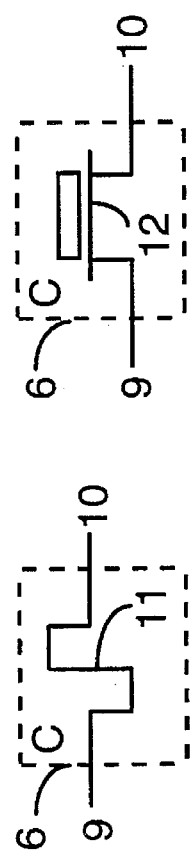

INTEGRATED CONTENT ADDRESSABLE READ ONLY MEMORY

BACKGROUND

1. Field of Invention

This invention relates to Content Addressable Memories (CAM) used in data compression and robotics applications.

2. Description of Prior Art

Content Addressable Memories (CAM) are known since the early 1960's and several integrated chip sets are commercially available (examples are the AMD99C10 chips from Advanced Micro Devices and the MU9C1640 Cashe-CAM chip from MUSIC Semiconductors).

A CAM is usually defined as a device in which a binary data input pattern is compared with all the stored data words to find a matching binary pattern. The locations, if any, at which a matching data word is found then generates a binary output address code to indicate where the matching data pattern is stored. An additional MATCH output line may indicate of whether or not a matching pattern was found in the CAM. If several matching data words are found then a priority scheme may select one of the locations as the output address code. An alternate method would serially scan a normal Random Addressable Memory (RAM) to find a matching data pattern, but such solution would be too slow for most applications. Sorting the stored data words in a HASH code scheme for more rapid searching is still not fast enough for most applications. A forward pointing data tree (first described by Edward Sussenguth: reference: "Use of Tree Structures for Processing Files" Communications of the ACM, May 1963) is used to speed up memory searching in the international V.42bis compression standard for modems. This scheme is fast enough for data compression in modems but still not fast enough for data or image compression in modern high speed networks. Another common option is to swap the data input and the address input on a normal Random Addressable Memory (RAM) so that the memory is in effect addressed by the data word. The output address would then be stored as the data in the memory. This solution would require a huge memory capacity where most memory locations would remain unused. All of these solutions are unsatisfactory for application in high speed data compression and robotics.

Before a CAM can be used it must be pre-loaded with binary data words. Using normal Random Addressable Memory cells would require enormous power consumption for the anticipated applications. This would severely limit the practical memory capacity of the CAM and require a re-loading of the memory after every power down. In fact using any type of logic gates for storage or internal pattern comparison would consume so much power as to be unacceptable for very large CAM devices. An alternative is to use non volatile pattern storage such as: "Fuses" used in Programmable Read Only Memories (PROM); "Antifuses" used in Field Programmable Gate Arrays (FPGAs); or buried charges in the chip substrate known as FLUSH, EPROM, EEPROM or Ferro-electric (PLZT) technologies. The data pattern can also be incorporated into the original chip layout or deposited later by laser beams through transparent chip covers. Some of these known technologies allow for memory erasing and later re-programming.

In 1975 the inventor Klaus Holtz first described self learning networks in a patent application which later lead to U.S. Pat. No. 4,366,551. A first publication "Here comes the brain-like, self-learning, no-programming, computer of the future" appeared in the proceedings of "The First West Coast Computer Faire 1977". This research has meanwhile evolved into a new science called "Autosophy" and a new information theory which includes six known learning modes or "Omni Dimensional Networks". The new information theory is best described in a paper "Hyperspace storage compression for Multimedia systems" (IS&T/SPIE Electronic Imaging: Science and Technology Paper 2188-40) published in February 1994. One of the learning modes, the serial tree networks, are implemented in the CCITT V.42bis data compression standard which is now included in virtually all new modem designs. Tree network data compression can sometimes double the speed of transmission in modems or communications networks. The most recent references can be found in the proceedings of SuperCon96 "Data Compression in Network Design" and "Digital Image and Video Compression for Packet Networks". Similar learning modes, including the "Parallel Omni Dimensional Networks" are now being used for image and video compression. In the near future brain-like self-learning "Autosopher" may largely replace the programmed data processing computer. Self-learning and no-programming robots are now being developed.

To design and build the new self-learning Autosophy robots, including data or image compression, requires very large and inexpensive Content Addressable Memories (CAM) with features far in excess to what is now known or available. These new memory devices should have at least the following features:

1. Storage capacities should be very large and able to grow into Tera Bit ranges.
2. It should be very compact and robust to fit into small mobile robots or portable systems.
3. It must consume extreme little power for use in solar or battery driven systems.
4. It should be non volatile and retain its information at power-off.
5. It should be very inexpensive and include methods for self-repair.
6. Memory search access should be very fast and in the tens of nano second range.
7. Memory loading and learning may proceed during systems operations.
8. The devices could be erasable and re-programmable for recycling in other systems.

An attempt to provide very large and low power CAMs was previously disclosed in the Yoneda U.S. Pat. No. 5,388,065. This method uses a storage trait to define a connection, or non connection, between a first data line and an internal match line and a second storage unit defining the connection, or non connection, between a second data line to the match line using a control word line. The storage units can be composed of couplers such as non volatile memory elements like PROM, EPROM, EEPROM or UVE-PROM. While superficially resembling some aspects of the present invention the CAM function is implemented in a totally different way including a match line and control word lines which are not found in the present invention. The operation is dynamic and requires sensing of pulses on the match line while the present invention is static and requires no internal clocking.

Hashimoto in U.S. Pat. No. 5,329,488 discloses a non volatile semiconductor memory which replaces defective memory cells with redundant cells. This invention is not a Content Addressable Memory.

Ohri in U.S. Pat. No. 5,301,143 discloses a method of reading the state of internal fuses using external addresses. This is not a Content Addressable Memory using multiple bit output address codes.

OBJECTS AND ADVANTAGES

If the published "Autosophy" theory of "learning" and the new "Autosophy Information Theory" is correct then the present invention provides a true mathematical equivalent to the biological neurons in the brain. While brain neurons connect to other target neurons using dendrite fibers the new electronic CAROM neuron addresses connect to other target neuron addresses using digital address codes. Digital data storage is much more robust than dendrite fibers resulting in very reliable electronic brain equivalents. Autosophy theories provide the theoretical background for learning robots and electronic brains while the present invention (CAROM) provides the necessary physical implementation devices or memory. The new generation of brain-like self-learning autosopher cannot be built economically without the new CAROM memory device disclosed in this invention. According to the autosophy information theory "information" is re-defined as that which is not already known. This provides non linear storage and great lossless data compression in which the more information is already stored the less additional memory space is required to store additional information. A saturating storage requirement in an autosopher may provide many times the information storage as compared with normal linear computer storage. Autosophy data compression is already implemented in the CCITT V.42bis compression standard which can sometimes double the data transfer rate in modems. Autosophy image compression using "parallel" Omni Dimensional Networks has been published and demonstrated in software simulations.

In the present invention a CAM is formed by chains of Field Effect Transistors (FET) and connection units (C) which are inter-connected using a simple regular rows and columns matrix grid on a silicon chip. The grid and the cells can also be implemented by printed circuits and flat printed field effect transistors on a flexible foil. All the cell structures and interconnections are identical and distributed evenly over the chip area. This allows for the production of very large sheets of cells and connecting grid wiring printed onto a flexible foil. The foil containing the CAROM can be folded or rolled-up for very compact storage units in robots or portable devices. Flat sheets of CAROM storage can be mass produced and printed similar to Compact Disc Read Only Memories (CD-ROM). Flexible foil CAROM devices promise to be very robust and vibration or shock resistant. Mass production of the CAROM foil may provides very cheap and very large data storage devices.

Except for low power input data drivers and low power output address receivers the CAROM cells contain no active components or logic gates. Only one chain of Field Effect Transistors can conduct at any one time, according to the Autosophy algorithms, so that power consumption in the memory cell array would be negligible. The input driver and receivers may be separated from the memory cell array and shared by other memory cell arrays. This allows for the building of very large memory arrays which would consume extreme little power for use in solar or battery driven systems. Power consumption is very low and nearly independent of the memory capacity. Power consumption is "capacitive" and dependent on the number of accesses per second in the device. Rapid learning and "thinking" in the robot memory would require higher power consumption while a resting or inactive robot would require virtually no power consumption. Since very little power is consumed virtually no cooling is required.

The new memory device may be implemented as a static memory version or as a dynamic learning memory version. A static memory may find applications such as in "electronic books" where the information is pre-printed similar to a CD-ROM. Unlike a CD-ROM there is no need for a turn table or laser scanning. The information is imprinted onto flexible sheets, similar to CD-ROM manufacture, which can be assembled like pages in small electronic books. This totally solid state memory would provide quick access to any information without serial scanning. The information cannot be changed during operations. A dynamically learning robot memory version in contrast can absorb or learn new information at any time and forget seldomly used knowledge. The memory devices can be erased and recycled in other systems.

The new CAROM would feature very fast access and operations which may provide orders of magnitude faster operations than the human brain. Access speed, in the order of a few tens of nanoseconds, would be nearly independent of the memory size. A truly giant memory with tera bits of storage would have nearly the same near instant access as a smaller memory device. Because there is never any serial scanning to locate information the new "autosopher" promises to provide much faster information retrieval than the conventional data processing "computer". The new CAROM device can be used for both Content Addressable Memory (CAM) functions and serial Random Access Memory (RAM) functions.

A very large memory device is bound to have a few defects or memory errors during manufacture or operations. In a normal computer Random Addressable Memory (RAM) a single bit memory defect usually makes a device non functional. The new CAROM device in contrast can be repaired after manufacture or during operations by disabling memory words and by relocating the information to other stand-by memory words. This allows for the repair of slightly defective devices after manufacture or for automatic healing routines in an operating autosopher. Self-repair will dramatically reduce the cost of manufacture and the reliability of operating robots.

Setting non alterable fuses during systems operations may result in a tamper proof memory that cannot be altered later. This may find applications in systems logs or records which show true events without the possibility of tampering.

DRAWING FIGURES

FIG. 1 shows the overall layout of the new CAROM device consisting mainly of input driver circuits, output receiver circuits, strings of Field Effect transistors forming a logical AND gate and a matrix of identical connecting cells (C).

FIG. 2 shows a connecting cell (C) using fuse programming.

FIG. 3 shows a connecting cell (C) using memory transistors

REFERENCE NUMERALS AND SIGNAL NAMES IN THE DRAWINGS

1 Input driver (DR)
2 Output receiver (REC)
3 Terminator (T)
4 Field Effect Transistor
5 Diode function
6 Connecting Cell (C)
7 Driver output "true" signal
8 Driver output "false" signal
9 Connecting cell input 10 Connecting cell output
11 Programmable Fuse
12 Memory Transistor
Di First data input bit
Dn Last data input bit
Ai First address output bit
An Last address output bit
Wi First internal word line
Wn Last internal word line
Vh High power supply line
Vl Low power supply line
di First internal true data line
di* First internal false data line
dn Last internal true data line
dn* Last internal false data line
ai First internal address bit line
an Last internal address bit line DESCRIPTION FIGS. 1 to 3

FIG. 1 shows the typical layout and interconnections of the Content Addressable Read Only Memory (CAROM) device. The drawing is not intended to show the physical layout of the device. However, in some applications the indicated cells (C) 6 may be physically aligned in precise rows and columns as suggested in the drawing. The circuits may be divided between a power consuming interface section and the main memory array which consumes only negligible power.

The device interface section consists of a number of identical driver circuits (DR) 1 and a number of identical output receiver circuits (REC) 2. An identical terminator circuit (T) 3 is associated with each output receiver circuit (REC) 2. A driver circuit (DR) 1 can be implemented as a (low power) digital driver which produces a digital true and false output from the digital input signal. Such digital driver circuits are known in the art and commercially available. A receiver circuit (REC) 2 converts an analog voltage level input into a digital output signal according to an internal threshold bias. Such circuits are known in the art as "Schmitt Trigger", as "Comparator" or as Operational Amplifier (OP-AMP). The terminator circuit (T) 3 converts an electrical current into an equivalent analog voltage. In the simplest case a terminator may be implemented as a resistor.

The main memory array consists of many identical copies of connecting cells (C) 6, serial strings of Field Effect Transistors 4 and encoding diodes 5. The connection cells (C) 6 may contain static fuses, as will be shown later in FIG. 2, or as an alternative may contain memory transistors as will be shown later in FIG. 3. Both types of cells, fuses or memory transistors, may be mixed in the same CAROM device if desired. A Field Effect Transistor 4 is a device, known in the art as a FET, which blocks the current flow by a high resistance if the base is at a low voltage level. A high voltage level at the base allows the electrical current to flow through the FET at a low resistance. Some implementations of a FET will operate at the inverse levels: a low voltage at the gate produces low resistance while a high voltage at the gate produces a high resistance. A FET may be implemented on a silicon chip in a known technology. A FET may also be printed or deposited onto a thin foil, a technique known in flat panel display devices. The encoding diodes 5 allow electrical current to flow only in the forward direction while blocking the current in the reverse direction. Diodes can be implemented on a silicon chip using known techniques. A flat printed diode on a thin foil can be implemented as a FET by tying the base and the emitter together.

The input data to the CAROM device is applied as a multiple bit input data word Di to Dn where Di is the first input data bit while Dn is the last input data bit. Each input data bit Di to Dn, respectively, is applied to a driver circuit DR 1. Each driver circuit DR 1 will generate an output consisting of a true data line 7 and a false or inverted data line 8. Both the true data output line 7 and the false data output line 8 are applied and connected to respective connection cells in a respective column. In FIG. 1 the true output of the first driver di is connected to all the cells in the first column providing the true input for each cell. In the same manner the false output of the first driver di* is connected to all the cells in the first column providing the false input for the respective connection cells. Each driver circuit is similarly connected to a respective column of connection cells where dn and dn* show the connections of the last driver to the last column of connection cells. The output from the true and the false connection cells are connected together and applied to the base of a Field Effect Transistor 4.

All the Field Effect Transistors 4 are connected serially according to respective rows to form logical AND gates where each Field Effect Transistor represents one input to the logical AND gate. Each Field Effect Transistor output (drain) is connected to the input (emitter) of a Field Effect Transistor in the same row but in the next column. An exception is made in the first column in which the Field Effect Transistor input is connected to a (positive) power supply voltage Vh. In this way the Field Effect Transistors form a serial string (a serial AND Gate function) in which the output of each Field Effect Transistor is connected to the next Field Effect Transistor in the same row but in the next column. An exception is made for the output of the last Field Effect Transistor in a row which provides a word output line Wi to Wn. Each row of Field Effect Transistors, respectively, generates a separate word output line ranging from the first word output line Wi to the last word output line Wn. In the anticipated CAROM devices there could be many thousands or even Millions of rows each generating a separate word output line. Each row may contain many Field Effect Transistors to accommodate long digital input data words (Di to Dn).

All the individual word output lines Wi to Wn are connected via Diodes 5 and connection cells 6 to internal address bit lines, ai to an, where ai is the first internal address bit line and an is the last internal address bit line. Each internal address bit line ai to an, respectively, is connected to a Terminator 3 and a respective output receiver (REC) 2. The Terminators 3 are connected to a low power supply voltage line Vl (usually to ground). The output receiver (REC) 2 will sense an analog signal voltage on its respective internal address bit line to generate the final binary output address Ai to An where Ai is the first binary output address line while An is the last binary output address line. The output receiver (REC) 2 is a standard low power voltage sensing device containing a built-in discrimination threshold.

FIG. 2 shows a connection cell 6 implemented as a fusible link 11. The cell will either connect the input 9 to the output 10 or open the connection between the input 9 and the output 10. Most fuse connections once set cannot be altered later resulting in a tamper proof storage method. The following technologies are available to implement these fusible links:

a) The fuse connections may be selected during the chip lay-out according to a fixed pattern previously generated by Autosophy algorithms. This would provide a fixed pattern library on a generic chip which may find applications in data and image compression.

b) The fuse connections may be imprinted onto a foil medium similar to a Compact Disc Read Only Memory (CD-ROM). This process imprints tiny pits into the foil surface which are later scanned by a laser. The pattern of pits is usually imprinted into the disc surface during manufacturing. The tiny pits may be used, in this example, to cut fuses in a precise physical layout pattern. Unlike in a CD-ROM the CAROM needs no turning tables or lasers.

c) The fuses may be exposed through tiny holes in the foil surface. Depositing conductive ink into the holes, similar to a printing process, will make a fuse conductive while non filled holes will keep a fuse non conductive.

d) The fuse connections may be blown out by an external laser beam, through a transparent chip cover, during the manufacturing process or during systems operations.

e) The fuses may be individually blown out in a process now used in Programmable Read Only Memories (PROM). Each fuse can be selectively blown out by the application of an external address and an external programming voltage. Each fuse must have an individual address which is provided by a secondary address decoding grid according to known techniques used in PROMs. The secondary encoding grid may be implemented in a separate layer on a silicon chip or may be printed onto the back side of a thin foil CAROM. The fuse connections on the back side of the foil may then determine the cell connections in the CAROM array printed onto the front side of the foil.

f) The fuses may be set individually by "Antifuses" which are now used in Field Programmable Gate Arrays (FPGAs). Unlike in fuse blowing the connection changes from an initial high resistance to a low resistance after programming. Otherwise the techniques are similar to fuse blowing techniques.

FIG. 3 shows a connection cell 6 using memory transistors 12. Memory transistors provide for non volatile cell connections which once set up would consume no further power during operations. A memory transistor usually consists of a Field Effect Transistor (FET) and a charge pool deposited into the chip substrate by external programming methods. Normally a charged pool would make the Field Effect Transistor conductive to connect the cell input 9 to the cell output 10. An empty charge pool would make the Field Effect Transistor non conductive to disconnect the cell input 9 from the cell output 10. Some Field Effect Transistors use the opposite effect in which a charged pool would make the Field Effect Transistor non conductive while an empty charge pool would make the Field Effect Transistor conductive. Unlike in fuse programming the connection cell can be changed later during the systems operations. Depositing a charge into the Memory Transistors requires that each transistor must be separately loaded (charged) using a secondary addressing means and a high voltage programming pulse. The secondary address may be decoded in a separate layer on a silicon chip or on the back side of a thin foil CAROM device. The charge deposited onto the back side of a foil CAROM may then determine the conductivity or non conductivity of the connection cells on the front side of the foil. The following known technologies can be used:

a) Electrically Erasable Programmable Read Only Memories (EEPROM) technologies provide memory devices which can be erased on-board and reprogrammed later in the systems. These devices are now used in non volatile memory applications. A variation of this technology is known as FLUSH memories which can be erased and reloaded many times during the lifetime of a system.

b) A technique known as Ultra Violet Erasable Programmable Read Only Memory (UV-PROM) can be programmed during systems operations but requires eradiation with ultraviolet light through a transparent chip cover for whole chip erasure. These devices would allow continuous learning in an Autosophy robot but also provide for later memory erasure and recycling in other robots.

c) Ferro Electric memories contain an electro active PLZT (Lead Lanthanum Zinc Titanium) ceramic which can be charged from the outside to provide stable non volatile data storage. The charge pool is provided by flipping the polarity of bi-stable crystals.

Operations FIG. 1

The external operations of a CAROM in FIG. 1 consist usually of providing an input data word Di to Dn to the device which responds by generating an output address Ai to An. For each unique binary data input pattern there is usually a unique binary output address code. However in some applications several different input data words may generate the same output address code.

Each CAROM operation is initiated by applying an input data word Di to Dn to driver circuits 1 each of which would generate a true output 7 and a false output 8 to a respective column of connecting cells 6. The connection cells 6 would be set up (programmed) in advance so that only one of cell, either the right cell or the left cell, would conduct the respective data signal to the base of a Field Effect Transistor 4. If neither of the two cells is conductive then no current can flow through the chain of Field Effect Transistors 4 in a row resulting in an inactive or not used chain. If both cells would be conductive then the device is defective and cannot operate because of a short circuit connection between the true 7 and the false 8 input line. This condition is illegal and must be avoided. If all the bases in a chain of Field Effect Transistors 4 are at a true (high) level then a current will flow from the power supply input voltage Vh through the selected chain of Field Effect Transistors 4, through diodes 5 connected via connection cells 6 and finally via terminators 3 to the low power supply voltage Vl (ground). The chain of Field Effect Transistors 4 acts like a serial AND gate which will conduct only if all the bases on all the Field Effect Transistors are at a true (high) voltage level. The current flowing through any conductive chain activates a single unique internal word line, Wi to Wn, which via diodes 5 produces a multiple bit output address pattern on ai through an. The output address is determined in advance by a previously set pattern of selection cells 6. If a selection cell is conductive then a current will flow through the respective diode to activate the respective internal address line ai to an to produce a logical true output address bit. If the selection cell 6 is not conductive then no current will flow to the respective internal address line ai to an and the terminator 3 on that respective line will hold the voltage level to a low or logical false output address bit. The voltage level on each internal address line ai to an is sensed by a respective receiver circuit (REC) 2 which provides the respective output address bit Ai to An.

The input data words Di to Dn and the corresponding output address codes Ai to An are determined by the Autosophy algorithms which guarantee that each input data word is unique and will be encoded in only one row of connecting cells 6. There cannot be any multiple matches unless the device is defective. This assures that only one chain of Field Effect Transistors 4 can conduct and generate an internal word line Wi to Wn leading to an output address Ai to An. Since only one of the many internal chains can conduct at any one time, power is only consumed in that one chain. The result is that the power consumption is virtually independent of the memory capacity and a truly huge CAROM would consume virtually the same amount of power as a small CAROM.

Since all internal chains are simultaneously activated in parallel via the connecting cells 6 to the base of the Field Effect Transistor 4 the access time from the data input Di to Dn to the address output Ai to An is constant and nearly independent of the memory capacity. Access time in the order of a few tenth of nanoseconds would be nearly the same for a huge CAROM device as for smaller CAROM devices.

Charging the bases of all the Field Effect Transistors 4 requires a charging current from the driver circuits (DR) 1 which is "capacitive" and dependent on the memory capacity and the available power. Current is required only for charging and discharging the bases of the Field Effect Transistors 4 where once charging is complete virtually no further current will flow. Power consumption will therefore increase with the memory capacity because more Field Effect Transistor bases need charging or discharging. High activity or memory accesses (rapid thinking and learning in the robot) would require more power consumption while a static system (a resting robot) would consume virtually no power. If the power input is limited then the systems operations speed is determined by the available power. The larger the memory capacity the more Field Effect Transistor bases need to be charged and the longer it takes to access the memory. Solar or battery powered robots may have limited operations speed due to a limited power input.

Some of the data input bit lines Di to Dn may be used for other purposes including:

a) A clock input signal which would allows operations only after the other data input lines have settled. The address code output Ai to An would then appear after a predictable time delay. The preferred application would use the last data input bit Dn as the clock input.

b) If several separate CAROM arrays are used to expand the memory capacity then a few input data bits may be used as a selection address pattern. This allows for continuous expansion of the memory capacity in a system. Each CAROM array would only respond to its specific pre-programmed selection address.

c) An error detection bit, such as a parity check code, would prevent any address code output if the input data words contains an error. This would block operations for erroneous data input patterns and increase systems reliability.

The output address code Ai to An consist of a multiple bit binary pattern which is previously set up (programmed) by selection cells 6. A pattern of all zero bits should be avoided because an OR gate function of all the output address code bits may be used as a "match" line to indicate whether or not a matching pattern was found in the array. A multiple match in a defective CAROM device may produce an erroneous output address code. A method to detect such memory malfunction is to provide extra bits in the output address code. A single parity bit in the output address code may not be sufficient. A multiple bit check code, such as the Hamming Codes, may be used for added systems reliability.

Operations and Applications

Before a CAROM can function in a system it must be pre-loaded or programmed with appropriate input data patterns and output address code patterns. This is done using a combination of methods, such as fuse programming explained in FIG. 2 or memory transistor programming explained in FIG. 3. Several programming methods may be combined in the same device.

In fixed library fuse programming, such as in electronic books, the input data patterns and the output address codes are generated by Autosophy learning algorithms. The patterns are then burned, etched or printed into the selection cells 6 similar to the programming of CD-ROM discs. The selection cells may be aligned into precise rows and columns on a silicon chip or on a flexible foil.

In a programmable CAROM, using system programmable fuses or memory transistors, the data input patterns and the output address patterns can be set or programmed during systems operations. This requires a second selection grid which determines the location or address of the fuse or the memory transistor which are to be programmed. Normally this involves the application of a programming address, of the fuse or memory transistor, and a high voltage programming pulse. Once a cell is programmed it will remain set without further power consumption to provide non volatile data storage. Controlling the cell programming addresses must be provided by separate means which are already known and used in commercial devices such as in fusible PROMs, antifuses in Field Programmable Gate Arrays (FPGAs) or non volatile storage in EEPROMs and FLUSH memories. Programming by blowing internal fuses may provide a tamper proof record which cannot be altered or falsified later.

A CAROM device can be used either as a Content Addressable Memory (CAM), as a Random Addressable Memory (RAM) or as a pattern translator. For applications as a classical CAM an input data word Di to Dn is applied to the CAROM which will respond with a binary output address code Ai to An which shows where a matching data pattern was found in the memory. For applications as a RAM a binary input address is applied to the data word Di to Dn where the data output for the addressed memory location would appear on the output address Ai to An. The data words can be stored internally in any chain of transistors and need not be stored in consecutive order. For applications as a pattern translator any input data word Di to Dn can be translated into any output address code Ai to An but each input data word must be unique.

The data stored in a CAROM can be retrieved for Autosophy knowledge merging or for memory back-up. A binary counter pattern is applied to the data input Di to Dn and if a binary output address appears on Ai to An then both the data input and the output address are recorded for back-up. There is no need to record non matching patterns for back-up. A complete binary scan of the input data words would provide a complete list of the internal storage patterns for back-up. The recorded patterns can be merged with other patterns using Autosophy learning algorithms in which no "knowledge" is stored twice (one cannot learn what one already knows). A memory back-up record can be loaded into other CAROM devices using fuses or memory transistor programming.

Memory back-up records and error detection bits can be used to effect the self-repair of defective CAROM devices. If a data input word Di to Dn results in an error indication then that internal word (row of transistors) can be disabled by internal fuses. The data input word can then be stored in stand-by words (rows of transistors) using the back-up records. Disabling internal memory words in case of errors can be part of the device and proceed automatically during systems operations. The defective memory words are then later replaced in other memory locations during systems maintenance using back-up records.

SUMMARY, RAMIFICATION AND SCOPE

The Autosophy theories of "learning" provide algorithms for building brain-like self-learning robots while the new Autosophy "information theory" shows the way for great lossless data and image compression. Implementing the new theories in hardware requires new memory devices with features far in advance of present technologies. The new memories must be content addressable and operate at very high speed while using very little power. The physical construction must be cheap and robust to provide vast memory capacities in a small space to be suitable in robots and mobile systems. A Content Addressable Read Only Memory (CAROM) disclosed in this invention provides such a solution. Using only negligible power the new memory provides vast storage capacities operating at very high speed and at a very low cost. The new CAROM devices may improve already existing applications, such as data compression in the V.42bis standard modems. Autosophy image compression for graphics and video may open new applications for faster network communications, more efficient image and video storage in computer, and a new High Definition Television (HDTV). Combining the new Autosophy theories with the new CAROM devices may lead to intelligent robots and to brain-like self-learning Autosopher. The new Autosopher may eventually replace many applications in the now dominant programmed data processing computer.

I claim:

1. In a data processing system an integrated content or random addressable read only memory device in which a plurality of binary input data patterns, received by an input station, are converted into binary output address codes, on an output station, where each unique binary input data pattern results in a binary output address code, comprising:

means including at least two driver circuits for accepting the binary input data pattern from the input station and generating a true output signal and a false output signal for each binary bit, respectively, in the binary input data pattern through each driver circuit each generating an inverting or false and a non inverting or true output signal;

means defining a multiple line selection grid using rows and columns;

means for applying the true and the false output signals from each of the driver circuits to the columns of said multiple line selection grid;

means defining an array of logical and gates by serial rows of field effect transistors, each field effect transistor representing an input to the logical and gate;

means defining connection cells programmable for either connection or non connection;

means for connecting either the true or the false output signal from each driver output on the grid to said array of logical and gates via said connection cells so that each logical and gate is connected to a unique binary input data pattern;

means defining a diode function;

means for generating said binary output address code, when the unique binary input data pattern is applied, from the output of each logical and gate in the array via said diode function and said connection cells;

means for directing the resulting binary output address code to an output station.

2. A device as set forth in claim 1, where said connection cells are programmed during the device layout, through hard wired connections, according to a list of pre-assembled input data patterns.

3. A device as set forth in claim 1, where said connection cells are programmed during the manufacturing process, by setting internal fuses, according to a list of pre-assembled input data patterns.

4. A device as set forth in claim 3 where said fuses are set by mechanical indentations or pits in the device surface.

5. A device as set forth in claim 3 where said fuses are set by depositing conductive materials through holes in the device surface.

6. A device as set forth in claim 3 where said fuses are burned out on the device surface by an external laser beam.

7. A device as set forth in claim 3 where said fuses are blown out through a secondary fuse selection grid and the application of programming voltage pulses.

8. A device as set forth in claim 3 where said fuses are implemented as antifuses which are set through a secondary antifuse selection grid and the application of programming voltage pulses.

9. A device as set forth in claim 1, where said connection cells are implemented as memory transistors which are programmed by depositing electical charges into the chip substrate during the device operations using a secondary memory transistor selection grid and programming voltage pulses.

* * * * *